United States Patent [19]

Eitan et al.

[11] Patent Number: 4,998,220

[45] Date of Patent: Mar. 5, 1991

[54] EEPROM WITH IMPROVED ERASE STRUCTURE

[75] Inventors: Boaz Eitan, Sunnyvale; Eliyahou Harari, Los Altos, both of Calif.

[73] Assignee: WaferScale Integration, Inc., Fremont, Calif.

[21] Appl. No.: 189,874

[22] Filed: May 3, 1988

[51] Int. Cl.$^5$ ............................................. G11C 16/04
[52] U.S. Cl. ..................................... 365/185; 365/51; 365/218; 357/23.5
[58] Field of Search ............... 365/185, 184, 174, 182, 365/51, 218, 63, 72, 104; 357/23.5

[56] References Cited

U.S. PATENT DOCUMENTS

| | | | |
|---|---|---|---|
| 4,099,196 | 7/1978 | Simko | 365/185 |
| 4,314,265 | 2/1982 | Simko | 365/185 |
| 4,409,723 | 10/1983 | Harari | 357/23.5 |
| 4,503,519 | 3/1985 | Arakawa | 365/185 |
| 4,531,203 | 7/1985 | Masuoka et al. | 365/218 |
| 4,561,004 | 12/1985 | Kuo et al. | 357/23.5 |
| 4,639,893 | 1/1987 | Eitan | 365/185 |
| 4,763,299 | 8/1988 | Hazani | 365/51 |
| 4,905,995 | 9/1983 | Shirai et al. | 357/23.5 |

OTHER PUBLICATIONS

"A 16KB Electrically Erasable Nonvolatile Memory" by Johnson et al., published at the IEEE International Solid-State Circuits Conference, Feb. 14, 1980, pp. 152-153.

"An In-System Reprogrammable 256K CMOS Flash Memory," by Kynett et al., IEEE International Solid-State Circuits Conference, Feb. 18, 1988, pp. 132-133,330.

"Analysis and Modeling of Floating Gate EEPROM Cells," by Kolodny et al., IEEE Transactions on Electron Devices, vol. ED-33, No. 6, pp. 835-844, published in Jun. 1986.

"A 128K Flash EEPROM Using Double Polysilicon Technology," by Samachisa et al., IEEE Solid-State Circuits Conference, Feb. 25, 1987, pp. 76-77, 345.

"A 256K Flash EEPROM Using Triple Polysilicon Technolgy," by Masuoka et al., International Solid-State Circuits Conference, Feb. 14, 1985, pp. 168-169, 335.

"Trends in Non-Volatile Memory Devices and Technologies," by Maes et al., proceedings of the Seventeenth ESSDERC Conference, Sep. 14-17, 1987, pp. 743-754.

Primary Examiner—Glenn Gossage
Attorney, Agent, or Firm—Skjerven, Morrill, MacPherson, Franklin & Friel

[57] ABSTRACT

An electrically erasable programmable read only memory (EEPROM) constructed in accordance with the invention includes a source, a drain, a channel region formed between the source and drain, a floating gate extending over a first portion of the channel region but not a second portion of the channel region, and a control gate extending over a first portion of the floating gate and the second portion of the channel region. Of importance, the EEPROM includes an erase gate which is formed concurrently with the control gate and extending over a second portion of the floating gate. Because the erase gate is formed concurrently with the control gate, the process used to form the EEPROM requires only two layers of polysilicon. Also, because electrons tunnel between the floating gate and the erase gate during electrical erase instead of between the floating gate and the drain, there is no PN junction breakdown during electrical erase and therefore, the EEPROM array can be erased using a low current voltage supply.

7 Claims, 18 Drawing Sheets

EEPROM WITH IMPROVED ERASE STRUCTURE

BACKGROUND OF THE INVENTION

1. Field of the Invention

This invention relates to electrically erasable programmable read-only memories (EEPROMs) and in particular to structures for erasing EEPROMs.

2. Description of the Prior Art

A number of types of EEPROMs are available on the market. One type of EEPROM is programmed and erased using an electron tunneling mechanism. Such an EEPROM is discussed by Johnson et al. in a paper entitled "A 16 Kb Electrically Erasable Nonvolatile Memory", published at the IEEE International Solid-State Circuits Conference. On Feb. 14, 1980, pp. 152-153, 271, incorporated herein by reference. FIG. 1 illustrates the Johnson transistor in cross section. In the Johnson EEPROM 10, during programming, electrons tunnel from a drain region 12, through a tunneling oxide region 14, and onto a floating gate 16. During erase, electrons tunnel from floating gate 16 through the tunneling oxide 14 to drain 12. Unfortunately, the Johnson EEPROM has a number of drawbacks.

To ensure proper operation of EEPROMs which use tunneling for programming and erasing, tunneling oxide 14 must generally be formed to a thickness less than or equal to about 100 Å. This is because it is difficult to generate a large voltage across the tunneling oxide for both programming and erasing since the optimum capacitive coupling between the floating gate and the substrate is different for programming by tunneling as opposed to erasing by tunneling. This problem is exacerbated since by making tunneling oxide 14 thin, the capacitive coupling between drain region 12 and floating gate 16 is increased. This increase in drain-floating gate capacitive coupling makes it more difficult to program or erase the EEPROM of FIG. 1. Accordingly, to generate an electric field of appropriate magnitude for both programming and erasing, the tunneling oxide thickness is minimized. Unfortunately, it is difficult to form a tunneling oxide layer which has a thickness on the order of 100 Å due to the high defect density associated with such a thin oxide layer.

Another problem with the Johnson device is that the capacitive coupling between floating gate 16 and the other structures in the transistor must be optimized for both tunneling from drain 12 to floating gate 16 and from floating gate 16 to drain 12. Such optimization requires a large cell size.

Another problem is that after electrical erase, floating gate 16 is typically positively charged so that an N type inversion region may form under floating gate 16 extending from source 17 to drain 12 independently of the voltage at the control gate 18. Because of this, the EEPROM may remain on perpetually. Thus, Johnson must couple an extra select transistor (not shown in FIG. 1) between each EEPROM cell transistor and its corresponding bit line (see FIG. 3 of the Johnson reference) so that it is possible to individually sense the state of each transistor coupled to the bit line. This extra select transistor makes each transistor cell large and thus expensive.

Another problem is that because the programming and erase voltages are applied to control gate 18 and drain 12, respectively, the CMOS transistors within the decode logic of the EEPROM (used to apply read and erase voltages to selected drains and control gates with the EEPROM array) must be able to withstand high voltages without breaking down. Thus, the decode logic must be constructed using transistors having thick gate insulation and long channel regions. Such transistors tend to be large and slow.

Another type of EEPROM is programmed using a hot electron injection mechanism, i.e. the same mechanism typically used to program conventional EPROMs, but is erased by an electron tunneling mechanism, e.g. between the floating gate and source. See, for example, Kynett et al., "An In-System Reprogrammable 256 k CMOS Flash Memory", IEEE International Solid-State Circuits Conference, Feb. 18, 1988, pp. 132-133, 330. FIG. 2 illustrates an EEPROM 30 programmed by hot electron injection but erased by tunneling. EEPROM 30 has a cross section appearance similar to the Johnson EEPROM except that N+ source 33 is formed within an N− region 35 to mitigate the problem of band-to-band tunneling (discussed below) Also, the insulation between drain 32 and floating gate 34 is thicker than 100 Å, and is thus easier to build. In addition, it is easier to optimize the capacitive coupling between floating gate 34 and the other structures in the transistor for hot electron injection programming and tunneling erase than for a transistor using tunneling for both programming and erase. However, EEPROM 30 has a number of the drawbacks exhibited by the Johnson transistor. For example, because the EEPROM decode logic is exposed to the erase voltage, the decode logic must comprise transistors which are capable of handling large voltages. Such transistors are generally large and slow. Also, during electrical erase, it is possible to remove either too few or too many electrons from floating gate 34. If too many electrons are removed from floating gate 34, the floating gate will have a net positive charge, and therefore, the transistor may remain on regardless of the voltage applied to control gate 36. If too few electrons are removed from the floating gate during erase, the transistor may thereafter remain off regardless of the electrical potential at control gate 36. Thus, the amount of charge left on floating gate 34 must be carefully controlled, and it is difficult to attain such control over an EEPROM array including several hundred thousand transistors.

Another problem with EEPROM 30 is that during electrical erase, it is necessary to apply a large voltage to source 33 while connecting control gate 36 to ground in order to generate a large electric field across tunneling oxide 38. Unfortunately, this causes the junction between source 33 and P type substrate 42 to break down due to a mechanism known as "band-to-band tunneling." (Band-to-band tunneling occurs when the electric field generated under erase conditions causes a P+ inversion region, known as a deep depletion region, to form at the edge of the source. Current carriers tunnel from the source to the deep depletion region and are injected into the channel. This mechanism is described in greater detail by A. Kolodney et al. in the article "Analysis and Modeling of Floating Gate $E^2PROM$ Cells", IEEE Transactions on Electron Devices, Vol ED-33, No. 6, pages 835 to 844, published in June 1986, incorporated herein by reference.) Because the source-substrate junction breaks down, a large current flows through source 33 during erase, and therefore, the voltage supply coupled to source 33 must be capable of providing a large amount of current (typically 2 to 20 mA for a 256 K bit EEPROM) Because of this, the erase voltage applied to source 33 cannot be generated on chip using a voltage multiplier circuit, but must instead be generated off chip, using a separate power supply. Such power supplies are typically expensive to incorporate in a system environment.

When the source-substrate junction breaks down, holes from the deep depletion region can also be injected into and entrapped in tunneling oxide 38. The presence of these entrapped holes alters the tunneling characteristics of tunneling oxide 38. Different transistors within the EEPROM cell array may have varying numbers of holes entrapped within the tunneling oxide and this variation in the number of holes causes variation in the tunneling characteristics in the array of transistors.

The entrapped holes can also increase the electric field in portions of tunneling oxide 38 under erase conditions This increased electric field can stress and degrade tunneling oxide 38 so that it no longer effectively insulates floating gate 34 from drain 32 and source 33.

As mentioned above, N+ source region 33 is formed within an N− region 35, which mitigates, but does not prevent, the problem of band-to-band tunneling.

Another type of EEPROM cell transistor is transistor 50 illustrated in FIG. 3. Transistor 50 employs a split-gate EEPROM structure, i.e. floating gate 52 covers a first portion 53 of the channel region between N+ source 54 and N+drain 56, but not a second portion 57 of the channel region. Control gate 58 covers both floating gate 52 and second portion 57 of the channel region between source 54 and drain 56. Transistor 50 is erased by grounding control gate 58 and applying a large voltage (typically 15 to 20 volts) to drain region 56. Because of the split gate architecture, even if a positive charge remains on floating gate 52 after electrical erase, a conductive channel extending from drain 56 to source 54 will not form unless a high voltage (e.g. greater than 1.0 volts) is applied to control gate 58, and thus transistor 50 will not perpetually remain on. However, transistor 50 still has some of the drawbacks which affect transistor 30 (FIG. 5). For example, the decode logic coupled to drain 56 must be capable of handling large voltages. Also, during electrical erase, the high voltage applied to drain 56 causes junction 60 between drain 56 and P type substrate 62 to break down due to the above-mentioned band-to-band tunneling mechanism. Because of this, it is necessary to couple an external voltage source capable of providing a large amount of current to drain 56 during electrical erase. The breakdown of junction 60 also causes the above-mentioned problem of hole entrapment in silicon dioxide 64 between floating gate 52 and drain 56.

EEPROMs such as EEPROM 50 are described in more detail by Samachisa et al. in "A 128 K Flash EEPROM Using Double Polysilicon Technology". published at the IEEE Solid State Circuits Conference on Feb. 25, 1987, pp. 76-77, 345.

It is also known to provide a dedicated polysilicon erase gate in an EEPROM, e.g., as described in U.S. Pat. No. 4,531,203, issued to Masuoka et al., incorporated herein by reference. In such a structure, the floating gate is erased by causing electrons to tunnel from the floating gate to the polysilicon erase gate. Masuoka's structure is constructed by depositing and patterning three polysilicon layers. The first layer is used to form the erase gate, the second layer is used to form the floating gate, and the third layer is used to form the control gate. Thus, the process used to form this EEPROM is complicated and expensive.

Another type of EEPROM including a dedicated erase gate is discussed in U.S. Pat. No. 4,561,004, issued to Kuo et al., incorporated herein by reference. FIGS. 4a and 4b are simplified illustrations in plan view and cross section, respectively, of an array of transistors constructed in accordance with Kuo et al's patent. (FIG. 4b is the cross section along lines A—A of FIG. 4a.) A typical transistor within Kuo's array is transistor 70, which includes a source 72, a drain 74, a floating gate 76, a control gate 78, and an erase gate 80.

Kuo utilizes a split gate architecture, i.e. his floating gate 76 covers a first portion 84 of his channel region but not a second portion 86. Control gate 78 covers floating gate 76 and second portion 86 of the channel. Thus, even if floating gate 76 is positively charged after electrical erase, an N type inversion region forming under floating gate 76 will not extend from drain 74 to source 72, and thus transistor 70 will not remain turned on perpetually (Although floating gate 76 includes a portion 88 which extends all the way from drain 74 to source 72, portion 88 of floating gate 76 extends over the field oxide region of transistor 70, and thus an N type inversion region does not form under portion 88 of floating gate 76.

Kuo forms his source and drain regions 72 and 74 prior to forming floating gate 76. Unfortunately, if floating gate 76 is misaligned relative to the channel region, the length L of portion 84 of the channel underneath floating gate 76 can vary. If length L is nominally 1μm, under presently practical alignment tolerances, the actual value of length L will be 1μm±0.6 μm. This results in a very wide variation in performance between wafers processed in different lots. (The reasons for this variation are described in U.S. Pat. No. 4,639,893, issued to Eitan and incorporated herein by reference.)

SUMMARY OF THE INVENTION

An EEPROM in accordance with the invention provides the advantages arising out of a split gate architecture, a dedicated erase gate, and drain-floating gate self-alignment. An EEPROM constructed in accordance with the invention includes a source, a drain, a channel, and a floating gate. Of importance, a control gate extends over a first portion of the floating gate and an erase gate extends over a second portion of the floating gate. The transistor is erased by applying an erase voltage (in one embodiment, about 30 V) to the erase gate. Because the transistor is erased by applying a high voltage to the erase gate, there are no PN junctions which break down during erase. Also, there are no holes which become entrapped in the tunneling insulation during electrical erase as a result of PN junction breakdown in the vicinity of tunneling insulation.

Because the erase voltage is applied to the erase gate and not to the drain, the decode logic of the EEPROM is not exposed to the erase voltage, and thus the EEPROM decode logic does not have to be able to withstand large voltages Thus, the decode logic does not have to comprise transistors which are large and slow.

In accordance with one significant feature of the invention, the edge of the drain adjacent the channel is self-aligned with the edge of the floating gate. Thus, the portion of the channel length under the floating gate is defined by the floating gate itself. Therefore, the length of the channel portion under the floating gate is not dependent on the alignment of any photomasks. It is noted that the Kuo structure does not include a self-aligned drain region. Further, as described below, Kuo's structure and process are incompatible with a self-aligned drain. Thus, the present invention provides advantages which cannot be achieved by the Kuo EEPROM.

In accordance with one embodiment of the invention, the EEPROM is part of an array of EEPROM cell transistors including a plurality of rows of transistors. Two of the rows of transistors share a common source line and a common erase gate. Each floating gate includes a first portion which extends over a portion of its corresponding channel region and a second portion perpendicular to the first portion which extends underneath the erase gate. The source region is defined to follow a serpentine path around the second portion of the floating gates within the two rows of transistors. Because of this, the drain and source regions can be formed after the floating gate, and thus the drain region can be self-aligned with the floating gate.

In accordance with another embodiment, the array includes a plurality of source and drain regions which extend linearly in a mutually parallel direction. An array of floating gates is formed such that each floating gate extends between an associated one of the drain regions and an adjacent one of the source regions. The drain regions are self-aligned with the floating gates. A plurality of control gates are formed such that each control gate extends over part of the floating gates within an associated row of floating gates in a direction perpendicular to the source and drain regions. A plurality of erase gates are also formed such that each erase gate extends in a direction parallel to the control gates over part of the floating gates within an associated row of floating gates.

In another embodiment, an array of source/drain regions are arranged in rows and columns, each column of source/drain regions being connected to an associated common bit line. Each row of source/drain regions are separated from the adjacent row of source/drain regions by thick field oxide. An array of floating gates is formed such that each floating gate includes a first portion extending between a pair of associated source/drain regions and a second portion extending over the field oxide. A control gate extends in a direction perpendicular to the common bit lines and over the first portion of the floating gates within an associate row of floating gates. An erase gate extends over the field oxide and the second portion of the floating gates within an associated row of floating gates.

The EEPROM of the above-described embodiments is typically formed using two layers of polysilicon, with the floating gate being formed from the first layer and the control and erase gates being formed from the second layer. Thus, the EEPROM is produced using a simpler and less expensive process than that used by Masuoka and Kuo. Further, because the control and erase gates are formed by the same photomask, it is impossible to misalign the erase gate relative to the control gate. Instead of using polysilicon, other conductive materials, e.g. tungsten silicide, can also be used.

These and other advantages of the present invention are discussed in greater detail below.

DETAILED DESCRIPTION

Figure 5:
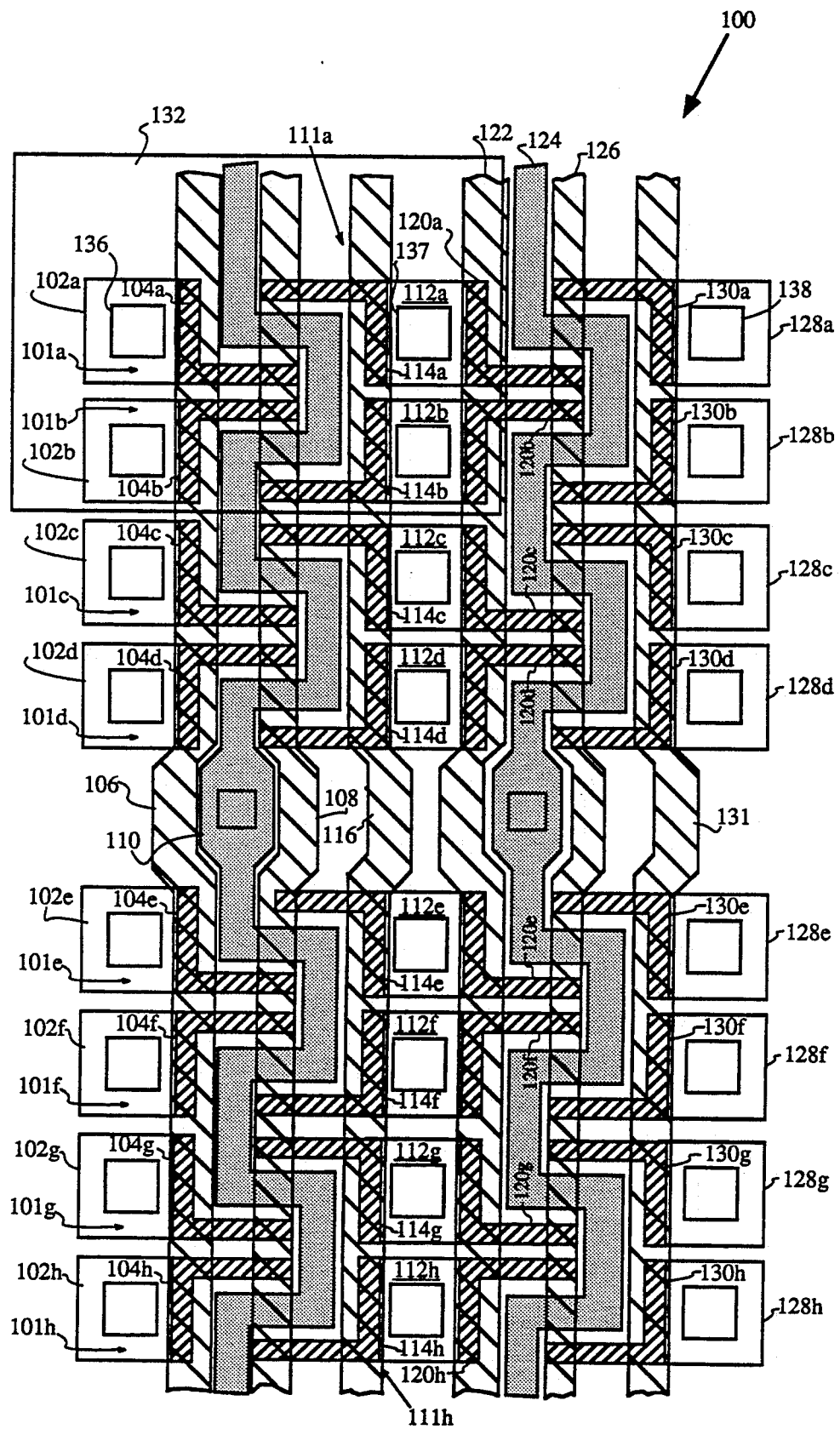
FIG. 5 is a plan view of an EEPROM constructed in accordance with one embodiment of the invention.

FIG. 5 illustrates portions of four rows of EEPROM transistors constructed in accordance with one embodiment of the invention. (As used herein, rows of transistors share a common word line, i.e. a common control gate. Columns of transistors share a common bit line, i.e. a common drain lead.) Although FIG. 5 only illustrates portions of four rows, it will be appreciated that the rows illustrated in FIG. 5 are typically part of a much larger array of floating gate transistors of like construction and that each row of transistors extends upward and downward from what is shown in FIG. 5 and additional identical rows of transistors extend to the left and right of what is shown in FIG. 5.

The first row of transistors in FIG. 5 includes N+ drain regions 102a to 102h, floating gates 104a to 104h, a common control gate 106, a common erase gate 108, and a common N+ source 110. The second row of floating gate transistors includes N+ drain regions 112a to 112h, floating gates 114a to 114h, and a common control gate 116. In addition, the transistors within the second row of transistors share source 110 and erase gate 108 with the first row of transistors. The third row of transistors shares drain regions 112a to 112h with the second row of transistors, and also includes floating gates 120a to 120h, a common control gate 122, a common source 124, and a common erase gate 126. The fourth row of transistors includes drain regions 128a to 128h, floating gates 130a to 130h and a common control gate 131. The fourth row also shares source region 124 and erase gate 126 with the third row of transistors. In one embodiment, the drains of each transistor in a row are electrically connected to a common bit line. Thus, for example, drains 102a, 112a and 128a are connected to common bit line metallization 139 (not shown in FIG. 5, but illustrated in FIGS. 7a to 7f, described below) via contacts 136, 137 and 138, respectively The EEPROM of FIG. 5 is typically formed in a P− silicon substrate or a P−epitaxial layer.

Figure 6:
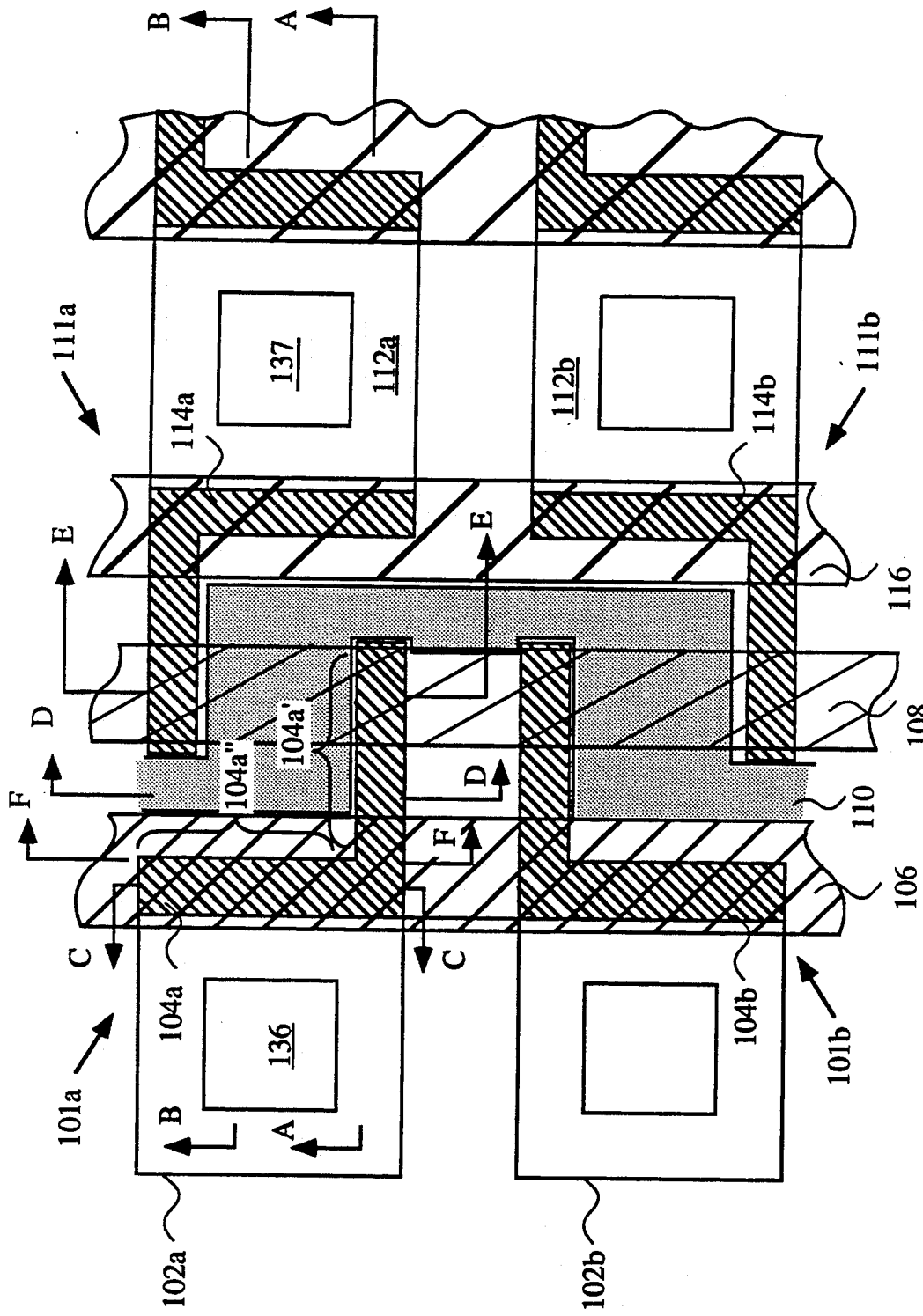
FIG. 6 is an expanded view of a portion of the EEPROM of FIG. 5.

FIG. 6 is an expanded plan view of the portion of the EEPROM of FIG. 5 within box 132. FIGS. 7a to 7f illustrate in cross section portions of the structure of FIG. 6 indicated by arrows AA, BB, CC, DD, EE and FF, respectively. The operation of transistor 101a of FIGS. 6 and 7a to 7f is described below, it being understood that the other transistors illustrated in FIG. 5 function in a like manner. Transistor 101a is programmed (i.e. a binary value is stored in transistor 101a) using conventional hot electron programming. Thus, if it is desired to program transistor 101a, the voltage at drain 102a is raised to about 8 volts and the voltage of control gate 106 is raised to approximately 12 volts, while source 110 is held at ground This causes hot electrons to be injected onto floating gate 104a, thereby causing floating gate 104a to have a negative charge. Because of this, the threshold voltage of transistor 101a is increased to a value greater than or equal to about 5 volts.

Drain regions 102b through 102h (FIG. 5) are typically grounded during programming of transistor 101a so that transistors 101b to 101h are not also simultaneously programmed.

When it is desired to read transistor 101a, 2 volts are applied to drain 102a, 5 volts are applied to control gate 106 and zero volts are applied to source 110. The current flowing through drain 102a is sensed to determine if floating gate 104a is negatively charged (in which case, current will not flow through drain 102a) or if floating gate 104a is not negatively charged (in which case, current will flow through drain 102a). Thus the binary value stored in transistor 101a can be determined by detecting the drain current.

When it is desired to erase transistor 101a (i.e. remove electrons from floating gate 104a), control gate 106 and drain 102a are held at ground and a high voltage (typically about 30 volts) is applied to erase gate 108. This causes electrons to tunnel from floating gate 104a onto erase gate 108. (During erase, source 110 is held at a high voltage, e.g. greater than 5 volts, and in one embodiment 12 volts, to reduce the voltage across)and the electric field through, the insulation layer separating source 110 from erase gate 108, and to thereby enhance the reliability of the source-erase gate insulation.) In one embodiment of the invention, the EEPROM is a flash EEPROM, i.e. all of the transistors in the array of FIG. 5 are erased simultaneously.

In summary, Table I below indicates the voltages applied to the various structures in transistor 101a during programming, reading and erase.

Figure 12:
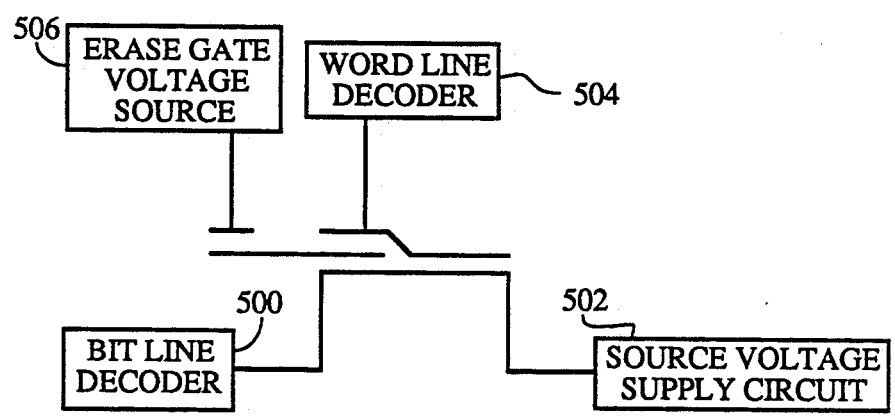
FIG. 12 schematically illustrates transistor 101a of FIG. 5.

The voltages applied to the drain, source, control gate, floating gate and erase gate are provided by a bit line decoder 500, a source voltage supply circuit 502, a word line decoder 504 and an erase gate voltage source 506, respectively (see FIG. 12).

TABLE I

|  | Voltage at Drain 102a | Voltage at Control Gate 106 | Voltage at Source 110 | Voltage at Erase Gate 108 |
|---|---|---|---|---|
| Programming | 8 volts | 12 volts | 0 volts | 0 volts |
| Reading | 2 volts | 5 volts | 0 volts | 0 volts |
| Erase | 0 volts | 0 volts | 12 volts | 30 volts |

After electrical erase, floating gate 104a is typically positively charged, and thus an N type inversion layer typically forms under a portion of floating gate 104a independently of the voltage applied to control gate 106. However, because transistor 101a employs a split gate architecture in the active channel region, transistor 101a will not remain on permanently as a result of the positive charge on floating gate 104a. Referring to FIGS. 6 and 7b, a first portion 140 of the channel region between drain 102a and source 110 is covered by portion 104a" of floating gate 104a, while a second portion 142 of the channel region is covered by a portion of control gate 106. Thus, even when floating gate 104a is positively charged and an N type inversion layer is permanently present under portion 104a" of gate 104a, a channel cannot form between drain 102a and source 110 unless control gate 106 is raised to an appropriate voltage (e.g. greater than 1.0 volts) to form an inversion region under control gate 106. Accordingly, after electrical erase, transistor 101a exhibits a threshold voltage of about 1.0 volts.

Figure 7A:
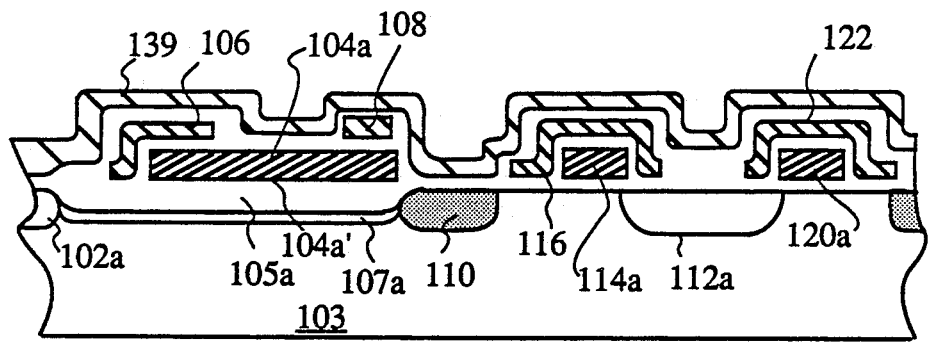
FIGS. 7a to 7f illustrate in cross section portions of the EEPROM of FIG. 6.
Figure 7B:
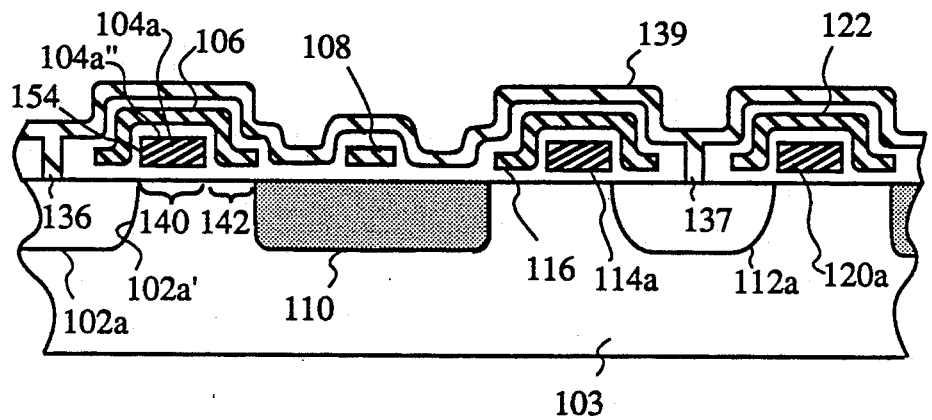
Figure 7C:
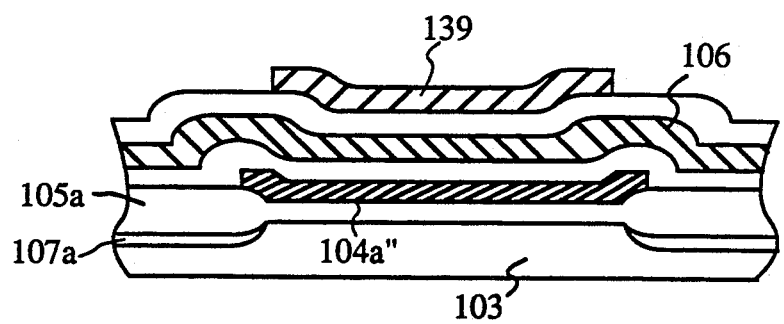
Figure 7D:
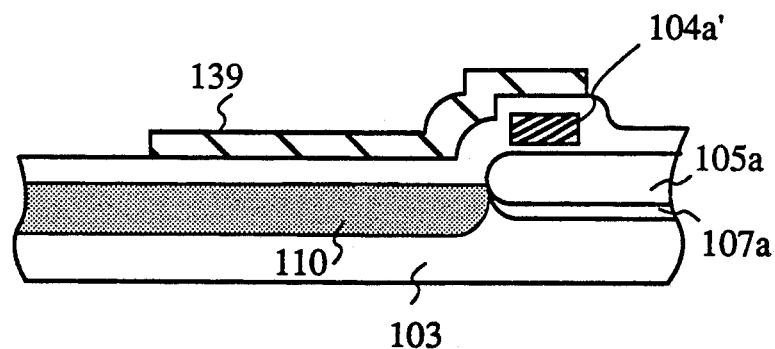
Figure 7E:
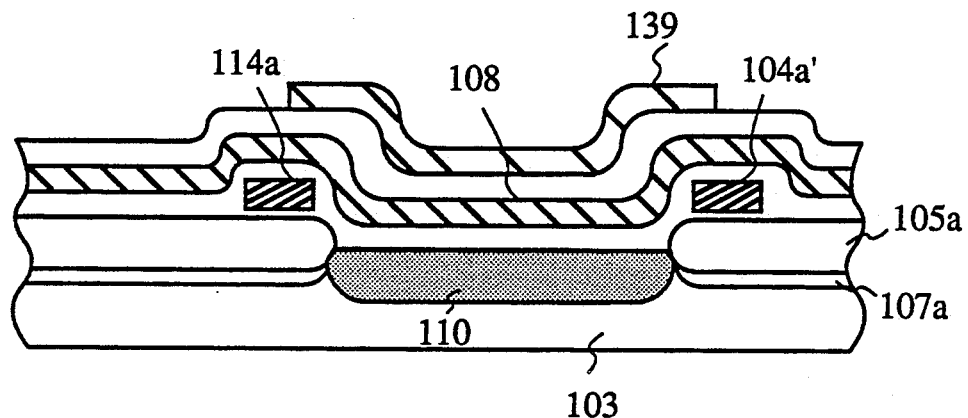
Figure 7F:
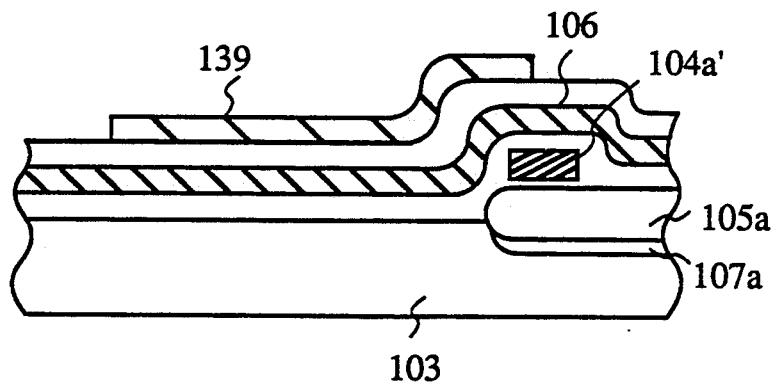

A second portion 104a' of floating gate 104a extends from source 110 to drain 102a, as shown in cross section in FIG. 7a and in plan view in FIG. 6. However, portion 4a' of floating gate 104a is formed over a thick field oxide region 105a (approximately 6000 Å thick) which in turn is formed over a P type region 107a. Region 107a is more heavily doped with P type impurities than P− substrate 103 to form a channel stop under portion 104a' of floating gate 104a. Oxide 105a and region 107a prevent a conductive channel from forming between source 110 and drain 102a under portion 104a' of floating gate 104a, even if floating gate 104a is positively charged and a high voltage is applied to control gate 106. Regions 105a and 107a are not illustrated in FIG. 5 to simplify the illustration. However, the lateral extent of field oxide 105a and P+ region 107a, and corresponding field oxide and P+ regions formed under floating gates 104b to 104h, 114a to 114h, 120a to 120h and 130a to 130h are illustrated in section line such as the section lines associated with regions 118 in FIG. 5a.

Figure 5A:
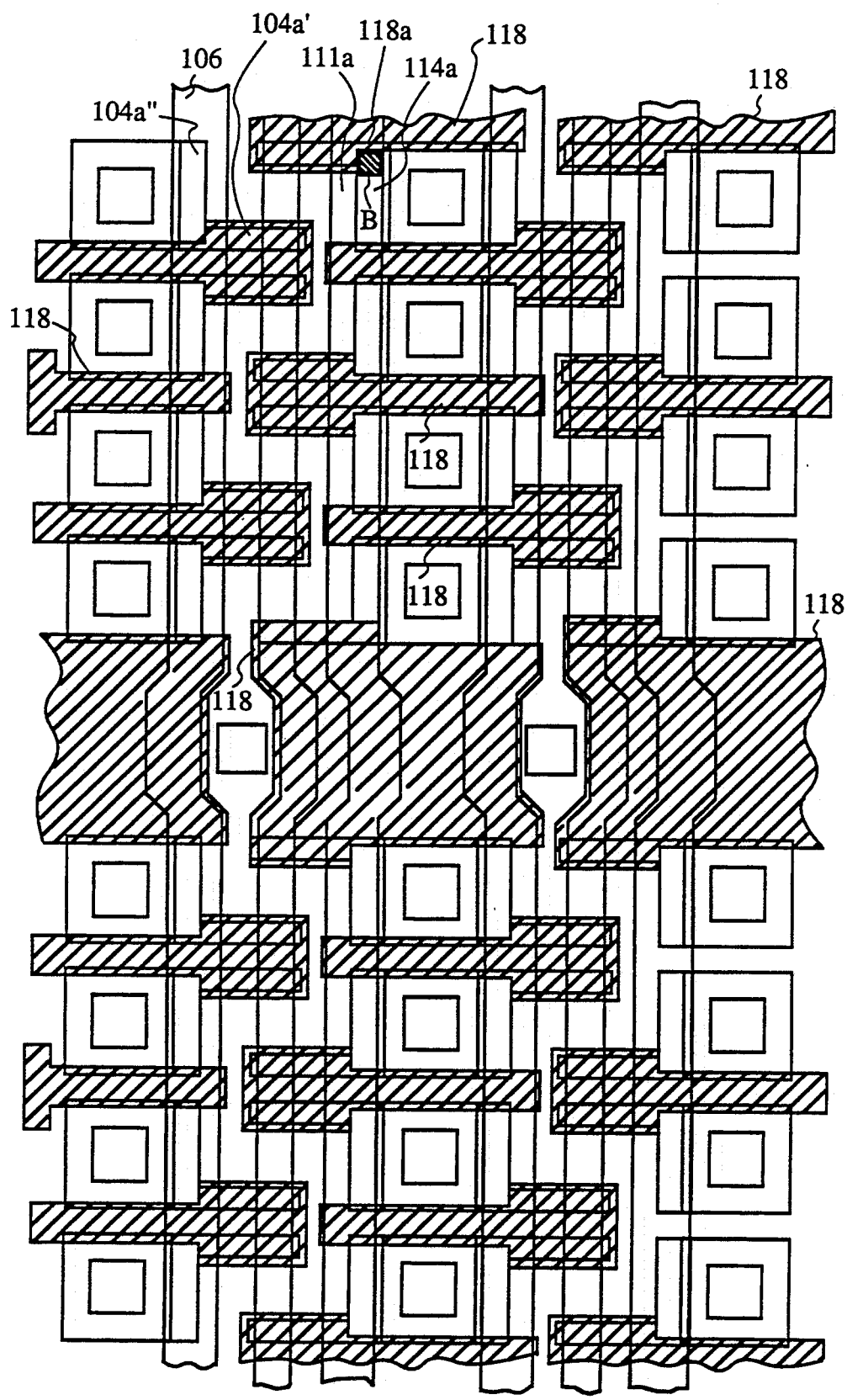
FIG. 5a illustrates the location of field oxide regions within the EEPROM of FIG. 5.

Referring to FIG. 5a, it is seen that field oxide 118 includes a notch 118a such that an area B of floating gate 114a does not extend over field oxide 118, but instead is only separated from underlying P type substrate 103 by relatively thin (about 300 Å) silicon dioxide insulation. Because of notch 118a in field oxide 118, when transistor 111a is on, an inversion region forms in area B of the channel of transistor 111a, thereby adding to the read current of transistor 111a. Similar notches in corresponding field oxide regions 118 enhance in the same way the read currents of the other transistors in EEPROM array 100.

Figure 5B:
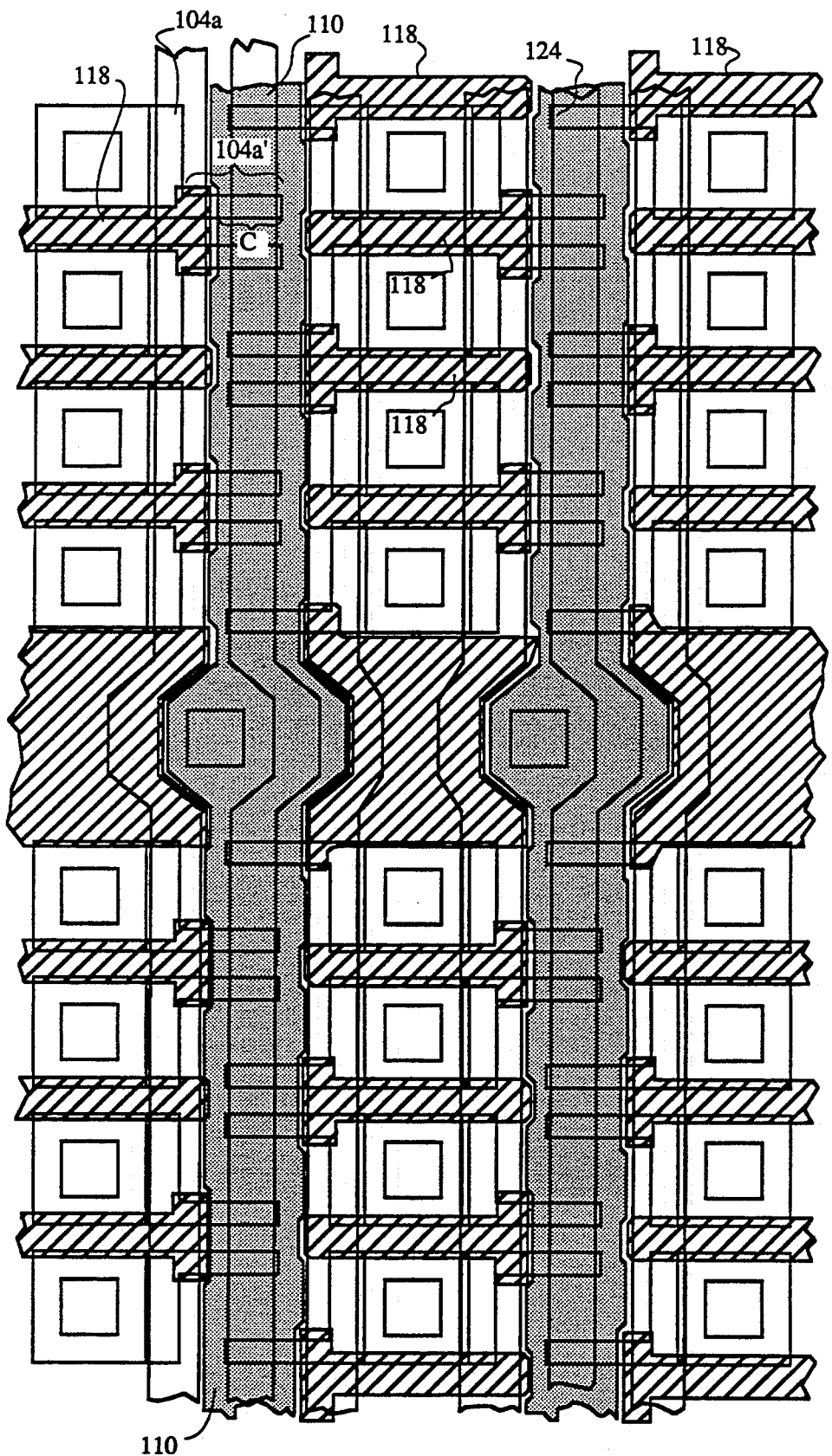
FIGS. 5b and 5c illustrate the location of field oxide regions and source regions in an EEPROM constructed in accordance with two alternate embodiments of the invention.
Figure 5C:
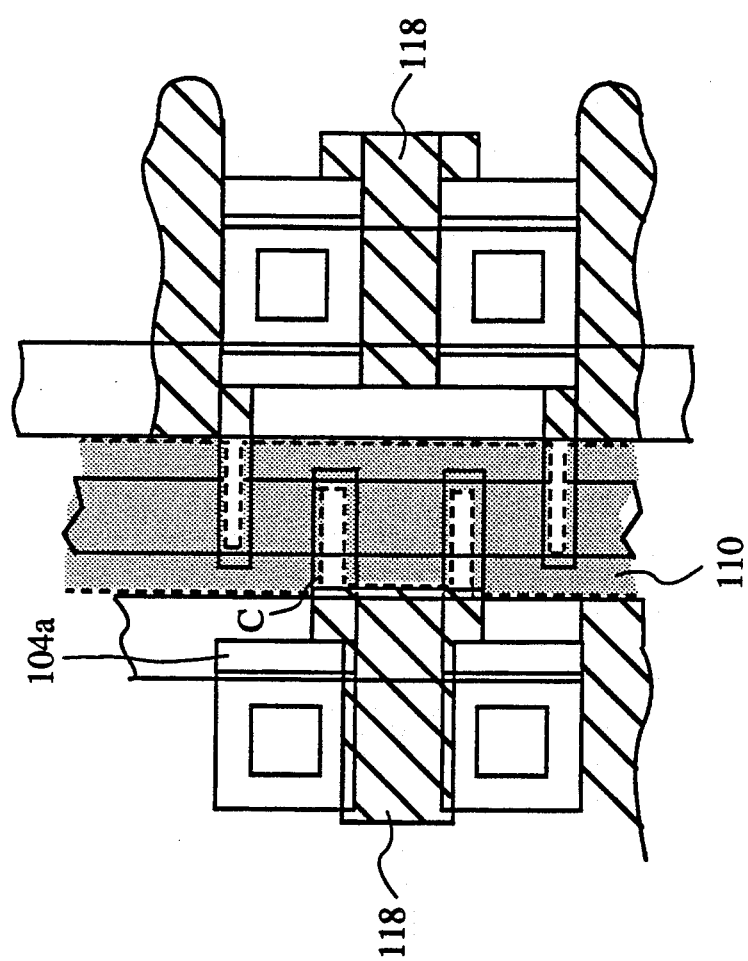

FIG. 5b illustrates in plan view the location of field oxide regions 118 in accordance with an alternative embodiment of my invention. In the embodiment of FIG. 5b, field oxide 118 does not extend under the entire length of portion 104a' of floating gate 104a. In this embodiment, source 110 (which is formed after the floating gates are formed) extends underneath the part C of portion 104a' which does not extend over field oxide 118. (The reason source 110 extends under part C is that after the implantation step which results in the formation of the EEPROM source and drain regions, the wafer is subjected to a thermal drive-in step (discussed below) during which source 110 is extended underneath part C of floating gate 104a.) In one embodiment, source 110 extends under all of part C and the corresponding portions of the other floating gates in the EEPROM array (e.g. as illustrated in FIG. 5b). In another embodiment, source 110 is only diffused to extend underneath a portion of part C, e.g. as illustrated in the expanded plan view of FIG. 5c. Of importance, by diffusing source 110 underneath the floating gates as illustrated in FIGS. 5b and 5c, the series resistance exhibited by source 110 is reduced relative to the series resistance of the source 110 shown in the embodiment of FIG. 5a.

In the embodiment of FIG. 5, source 110 follows a serpentine path around portion 104a' of floating gate 104a and around corresponding portions of floating gates 104b to 104h and 114a to 114h. As a result, this one continuous source 110 can serve simultaneously as a source for transistors on each side of the source region 110. Source 110 follows a path which extends alternately first on one side of erase gate 108 and then crosses under (but is insulated from) erase gate 108 and extends on the other side of and along erase gate 108 and repeats this pattern along the array. This is possible because (as described below) source 110 is formed prior to erase gate 108. Another advantage of defining the source region so that it follows a serpentine path is that the source (and drain) can be formed after the floating gates, and thus, the drain regions can be self-aligned with the floating gates.

A selected edge of each of drains 102a to 102h is self-aligned with the closest edge of portions 104a" to 104h" of corresponding floating gates 104a to 104h. The other drain regions of EEPROM 100 are similarly self-aligned with their corresponding floating gates. Drain-floating gate self-alignment enhances the programming efficiency of the EEPROMs for reasons discussed in U.S. Pat. No. 4,639,893. This added programming efficiency is particularly important because floating gates erased in accordance with the present invention are typically positively charged, and more drain current is required to program positively charged floating gates than electrically neutral floating gates. One reason for this is that more electrons are required to negatively charge a previously positively charged floating gate than a neutral floating gate. Another reason for this is that more current must flow through the transistor to create the conditions necessary for the hot electron injection of electrons onto a positively charged floating gate than an electrically neutral floating gate. Because more current flows through the floating gate transistor, more current also flows through the peripheral circuitry coupled in series with the transistor, there is a greater voltage drop across the peripheral control circuitry, and thus there is less voltage across the floating gate transistor available for programming the transistor. The voltage available for programming when the floating gate is positively charged is further decreased because the voltage drop across the portion of the channel covered by the control gate tends to increase at the expense of the voltage drop across the portion of the channel covered by the floating gate. Because of these effects, self-aligning the drain and floating gate to enhance programming efficiency of a transistor when combined with a floating gate which can be positively charged, as in this invention, is particularly desirable.

Another advantage of the present invention is that it uses only two polysilicon layers instead of three. Floating gates 104a to 104h, 114a to 114h, 120a to 120h and 130a to 130h (FIG. 5) are formed from the first polysilicon layer and control and erase gates 106, 108, 116, 122, 126 and 131 are formed from the second polysilicon layer. Because of this, the process used to form the present EEPROM is simpler and less expensive than the process used to form an EEPROM using three layers of polysilicon. Further, because the control and erase gates are defined using a single mask, it is impossible to misalign the control gate relative to the erase gate. Another important advantage of using a two polysilicon structure is that it is only necessary to provide good metallization step coverage over two polysilicon layers instead of three polysilicon layers. Thus it is easy to obtain good metallization step coverage and high manufacturing yields when producing the EEPROM of the present invention.

Figure 1:
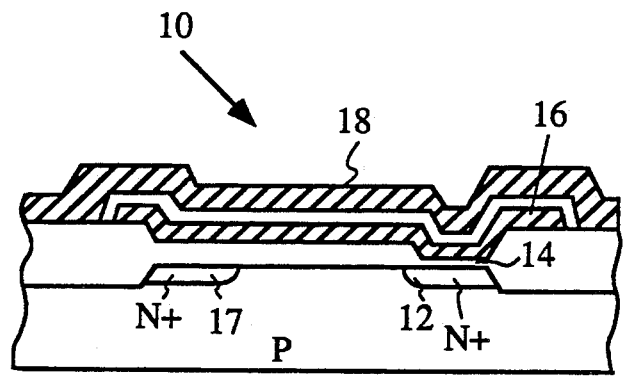
FIGS. 1 to 3, 4a, and 4b illustrate various EEPROM cell transistors constructed in accordance with the prior art.
Figure 2:
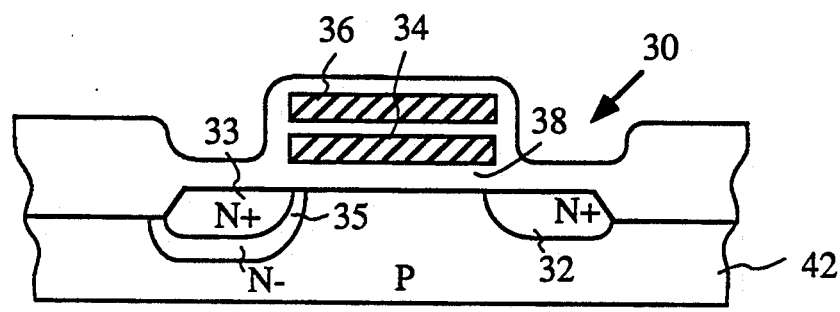
Figure 3:
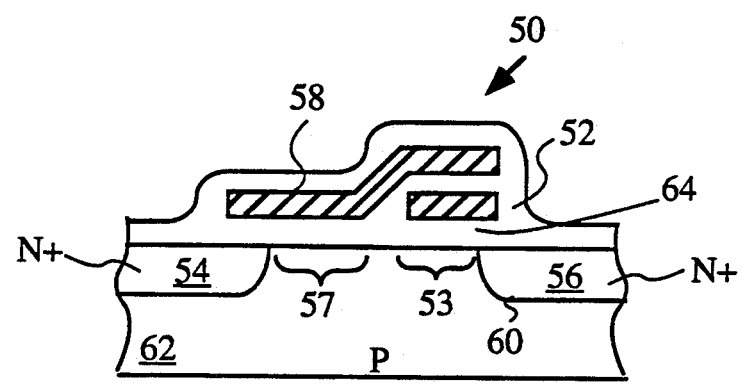
Figure 4A:
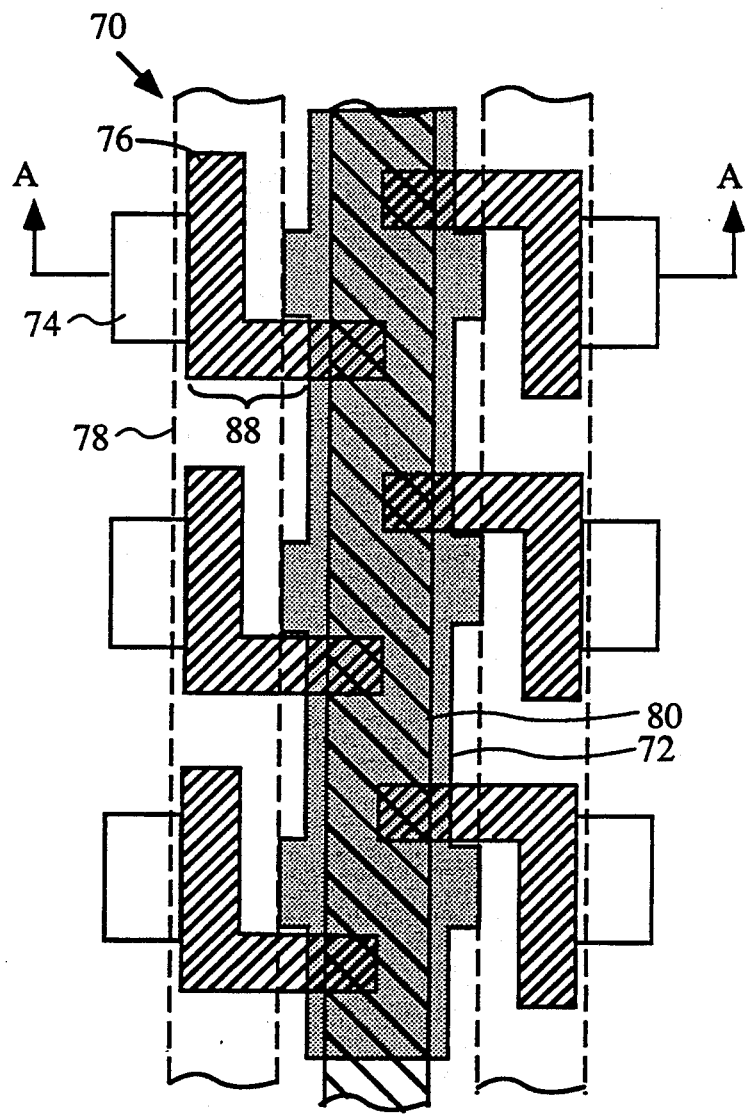
Figure 4B:
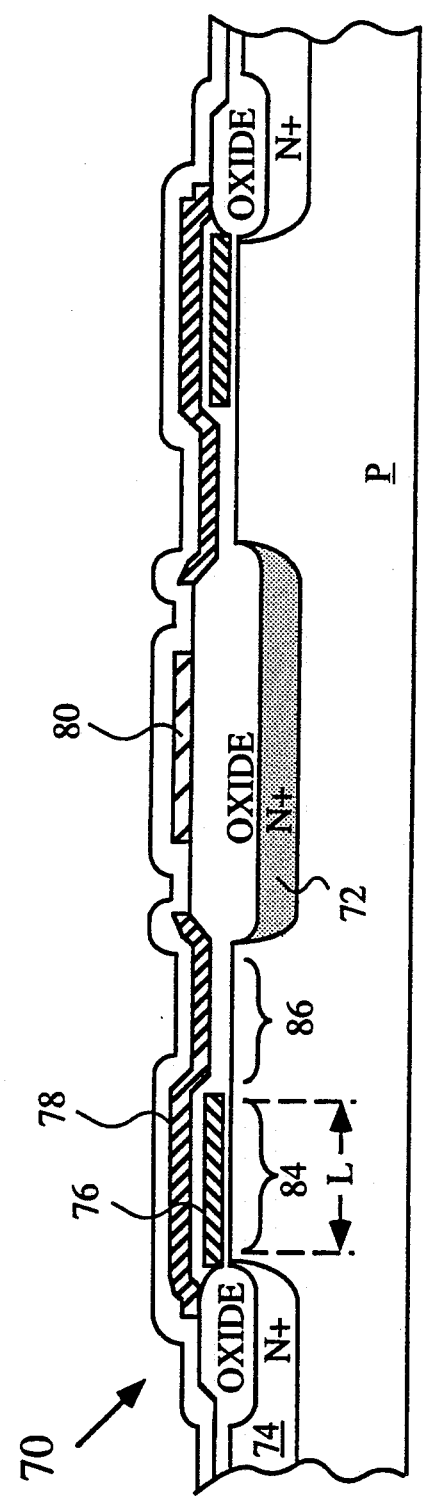

It is noted that because the 30-volt erase voltage is applied to polysilicon erase gates 108 and 126, there is no PN junction which breaks down during electrical erase of floating gates 104a to 104h, 114a to 114h, 120a to 120h and 130a to 130h (FIG. 5) due to the above-mentioned band-to-band tunneling mechanism. Therefore, there are no holes entrapped in the silicon dioxide insulation separating the channel region from the floating gate, and the tunneling and insulating characteristics of that silicon dioxide are not distorted. In addition, because there are no PN junctions which break down during electrical erase, electrical erase is accomplished with much less current than the current used to erase the prior art EEPROMs illustrated in FIGS. 2 and 3. For example, in a 256 K EEPROM exhibiting band-to-band tunneling, erase may require about 2 to 20 mA when erasing the entire array, whereas erasing a 256 K EEPROM in accordance with the present invention requires about 10 to 100 nA. Thus, the erase voltage can be generated on chip with a voltage source which produces a low output current such as a conventional voltage multiplier circuit, or a voltage multiplier circuit as described in U.S. patent application Ser. No. 137,782, filed Dec. 24, 1987 on an invention of Syed Ali, Reza Kazerounian and Boaz Eitan, assigned to WaferScale Integration, the assignee of this invention. This patent application is incorporated herein by reference.

Another advantage of the present invention is that because a high voltage is not applied to the EEPROM drain regions during electrical erase, there is no leakage current across the drain-substrate junctions in EEPROM 100 during electrical erase. Thus, the current required to erase array 100 is low for this reason as well. This advantage is particularly significant when erasing EEPROMs that are operating in a high temperature environment since junction leakage current increases with temperature.

Yet another advantage of the present invention is that because a high voltage is not applied to the EEPROM drain regions, the EEPROM CMOS decode logic (used to apply voltages to selected columns of drain regions during reading and programming) does not have to withstand large voltages.

One process for forming an EEPROM array in accordance with our invention is as follows. The description below refers to construction of transistor 101a and 111a, it being understood that corresponding structures within the other transistors of EEPROM array 100 are simultaneously formed.

Figure 8A:
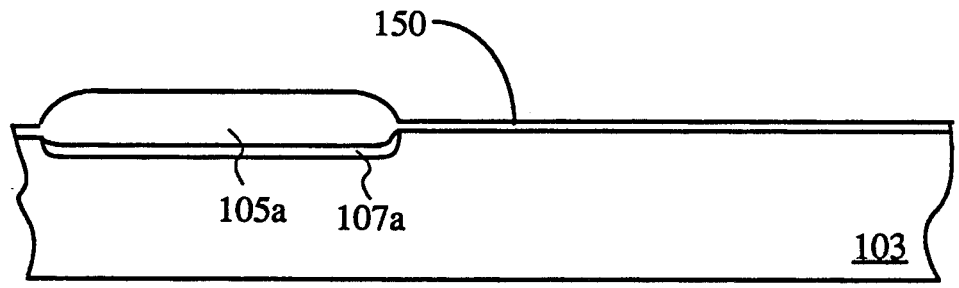
FIGS. 8a to 8h illustrate in cross section the EEPROM of FIG. 6 along lines AA during manufacturing.

1. As shown in FIG. 8a, P regions such as channel stopper region 107a and field oxide regions such as region 105a are formed at selected portions of P region 103 of a semiconductor wafer using a conventional technique, e.g. as described in U.S. Pat. No. 4,409,723 issued to Harari, incorporated herein by reference. (FIGS. 8a to 8h illustrate in cross section the EEPROM of FIG. 5 along line AA during manufacturing. FIGS. 9a to 9h illustrate the EEPROM along line BB during manufacturing.) In one embodiment, P region 103 has a dopant concentration of $10^{15}/cm^3$ and P region 107a has a dopant concentration of $10^{17}/cm^3$. Field oxide region 105a is about 4000 Å thick.

2. A thin (e.g., 300 Å) silicon dioxide layer 150 is then formed on the wafer surface. A portion of this thin silicon dioxide layer insulates subsequently formed floating gate 104a from underlying P region 103.

Figure 8B:
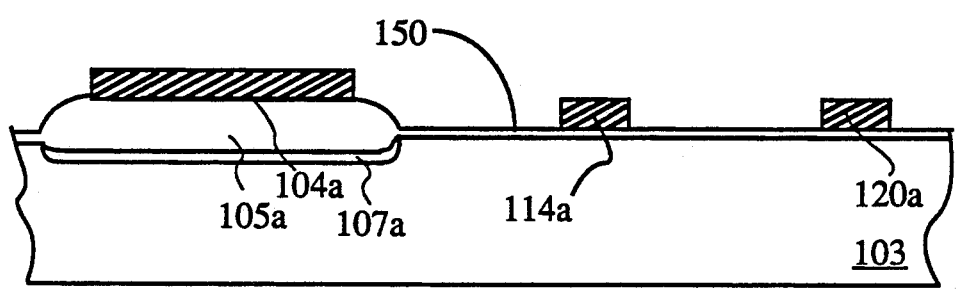
Figure 9A:
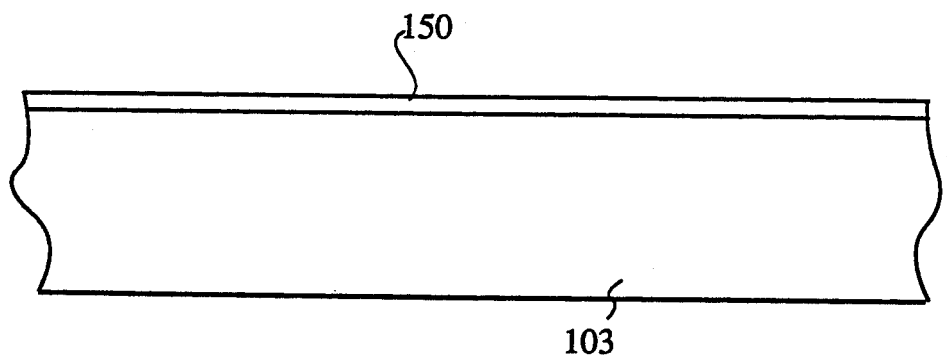
Figure 9B:
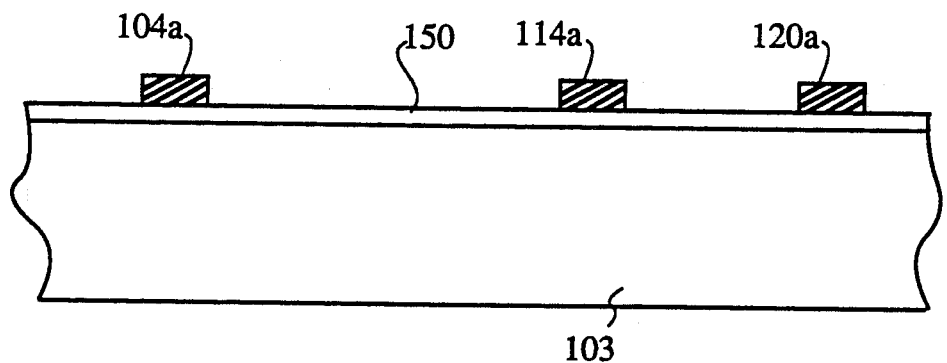

3. A first heavily doped polysilicon layer (from which floating gates 104a, 114a, and 120a are to be formed) is deposited on the wafer, e.g., by chemical vapor deposition (CVD) to a thickness of about 4000 Å. The first polysilicon layer is patterned using a conventional technique, thereby providing floating gates 104a and 114a. FIGS. 8b and 9b illustrate in cross section to-be-formed transistors 101a and 111a at the conclusion of this step.

4. A photoresist layer 152 (FIGS. 8c and 9c) is formed on the wafer and then patterned to define source region 110 and drain regions 102a and 112a. Of importance, photoresist layer 152 is patterned such that edge 102a' of to-be-formed drain 102a (FIG. 6b, FIG. 7b) is self-aligned with edge 154 of floating gate 104a. An edge of the other to-be-formed drains is similarly self-aligned with the edges of the floating gates. This is done in the manner described in the above-incorporated U.S. Pat. No. 4,639,893.

Figure 8C:
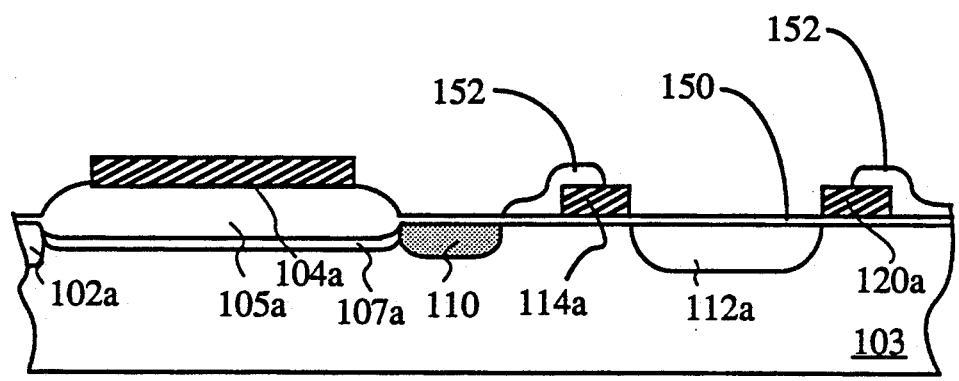
Figure 9C:
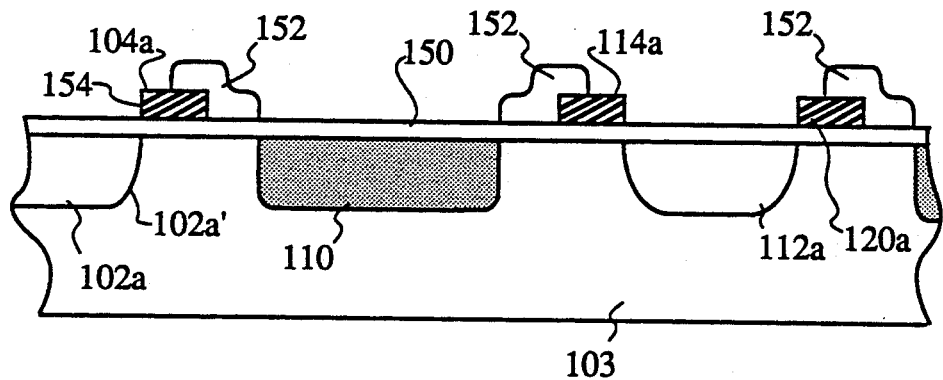

5. Drain regions 102a and 112a and source region 110 are formed, e.g., by ion implantation. Photoresist layer 152 is then removed and the wafer is subjected to a thermal drive-in step. FIGS. 8c and 9c show.

Figure 8D:
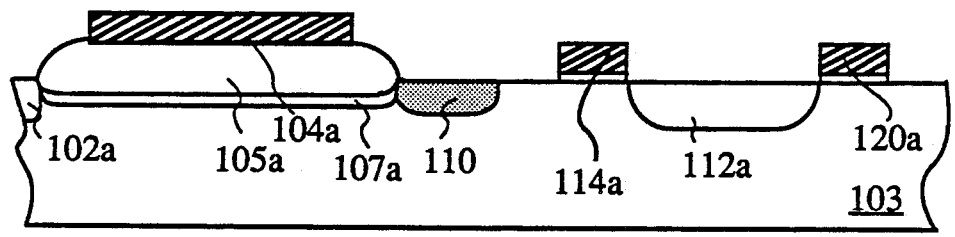
Figure 9D:
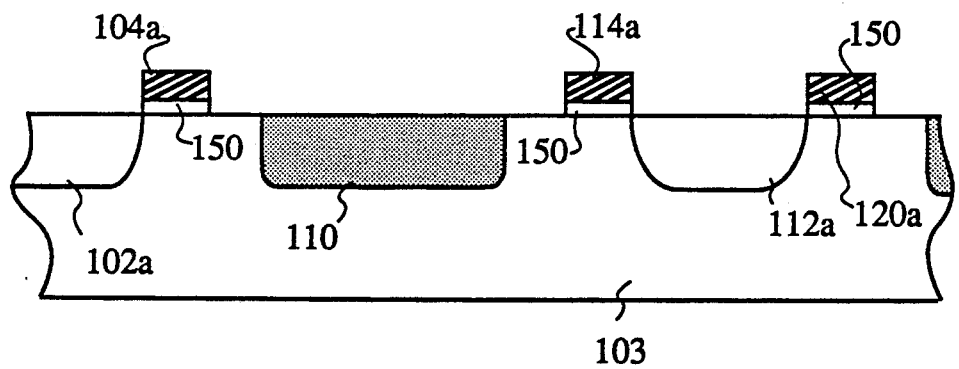

6. The wafer is placed in an hydrofluoric acid etching solution to remove the portion of silicon dioxide 150 formed on the wafer surface that is not protected by the floating gates (FIGS. 8d and 9d). Because of the thickness of field oxide 105a, only a negligible portion of field oxide 105a is removed during this step. The wafer is then removed from the HF solution.

Figure 8E:
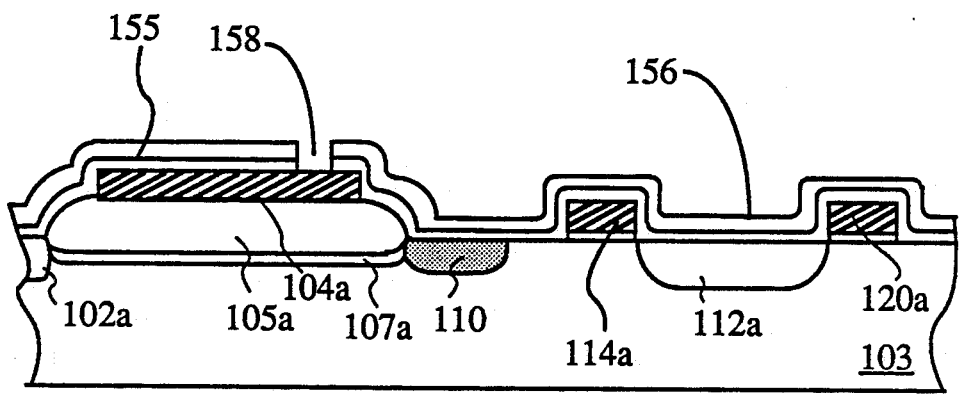
Figure 9E:
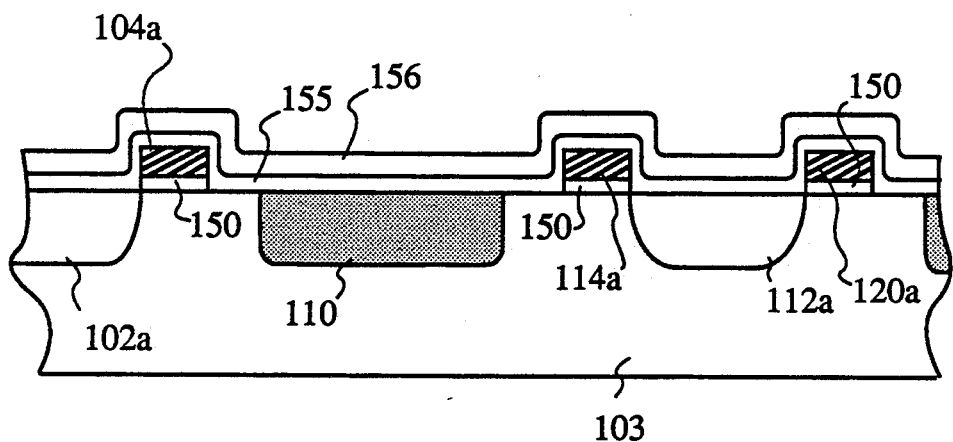
Figure 9F:
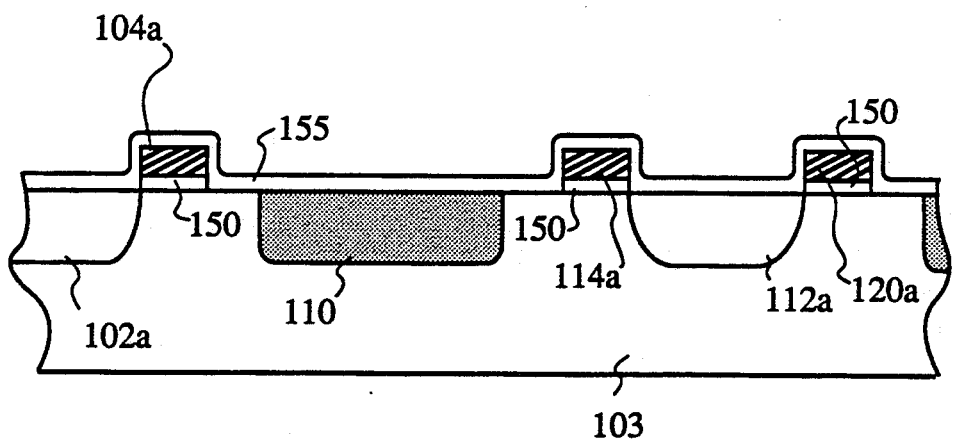

7. An insulation layer 155 (typically silicon dioxide) is grown on floating gate 104a to thickness of 400 Å, e.g., by thermal oxidation (FIGS. 8e and 9e). In one embodiment of our invention, this oxidation step can be accomplished by subjecting the wafer to a low temperature oxidation cycle (e.g. about 1000° C.) followed by a high temperature oxidation cycle. Advantageously, the oxide grown during the low temperature cycle prevents out diffusion of dopants from floating gate 104a during the high temperature cycle.

The wafer is then covered with a photoresist layer 156 which is patterned to define a tunneling region 158 (FIG. 8e) between the floating gate 104a and subsequently formed erase gate 108. The wafer is then placed in an hydrofluoric acid (HF) etching solution to remove any silicon dioxide in tunneling region 58 The portions of insulation layer 155 in the periphery of the EEPROM where CMOS control circuitry and decode logic are to be formed is also removed during this step.

Figure 8F:
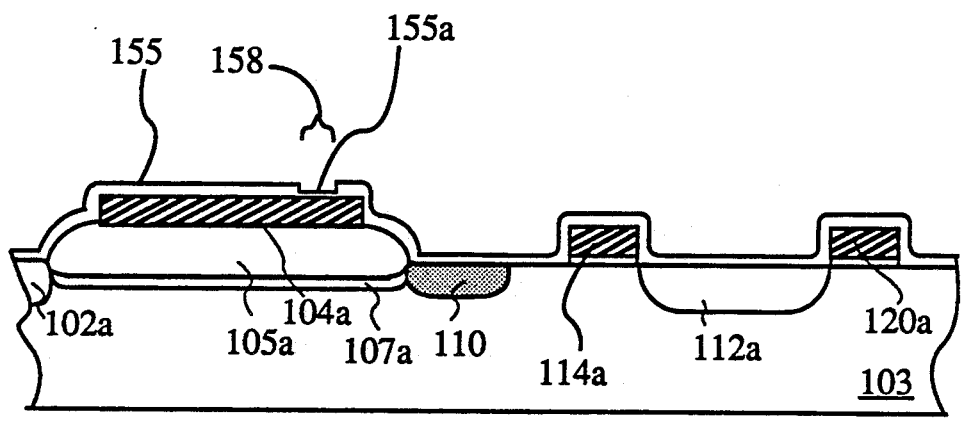

Photoresist layer 156 is then removed, and the wafer is subjected to another thermal oxidation process, during which silicon dioxide 155a is grown in tunneling region 158 above floating gate 104a, e.g. to a thickness of 400 Å (FIG. 8f). Concurrently, the thickness of the silicon dioxide elsewhere on floating gate 104a increases, e.g. to a thickness of 550 Å. During the process of growing silicon dioxide on the floating gates, silicon dioxide is also grown elsewhere on the active regions of the wafer, e.g. to a thickness of about 275 Å. The reason for the difference in the thickness of the silicon dioxide on the floating gates and on the active regions of the wafer is that silicon dioxide grows more rapidly over the heavily doped floating gates than over more lightly doped silicon.

8. A second heavily doped polysilicon layer is deposited on the wafer, typically to a thickness of 4500 Å, e.g , by chemical vapor deposition. (In another embodiment, 2000 Å thick doped polysilicon is deposited on the wafer, and a 2500 Å thick silicide layer, e.g. tungsten silicide, is deposited on the polysilicon.)

Figure 8G:
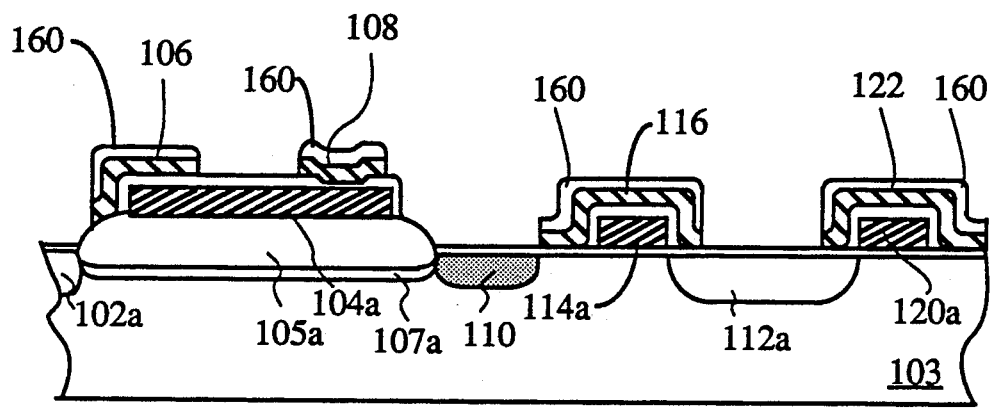

9. A photoresist layer 160 is formed on the wafer and then patterned, thereby exposing portions of the second polysilicon layer (or silicide layer). The exposed portions of the second polysilicon layer (or silicide and underlying polysilicon) are then removed, thereby leaving control gates 106 and 116 and erase gate 108 as shown in FIGS. 8g and 9g. Photoresist 160 is then removed.

Figure 8H:
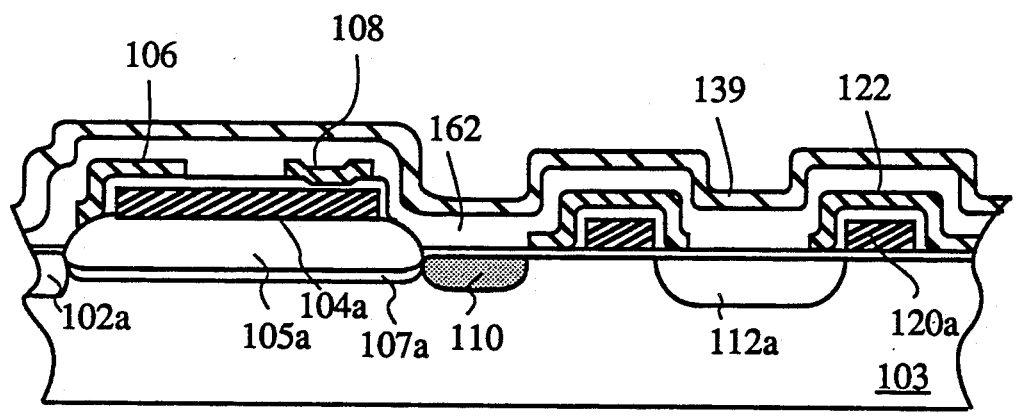

10. A silicon dioxide layer 162 is formed on the wafer, e.g. by a CVD process, to a thickness of 5000 Å to 7000 Å to insulate the control and erase gates from subsequently deposited metal. (FIGS. 8h and 9h.)

11. Contacts 136 and 137 (FIG. 9h) are opened in the silicon dioxide on the wafer surface in a conventional manner, and contact metallization metal 139 is deposited (e.g by evaporation or sputtering) on the wafer surface. The metal is then patterned.

12. A passivating layer (not shown in any of the Figures), such as another silicon dioxide layer is then formed on the wafer.

Figure 10:
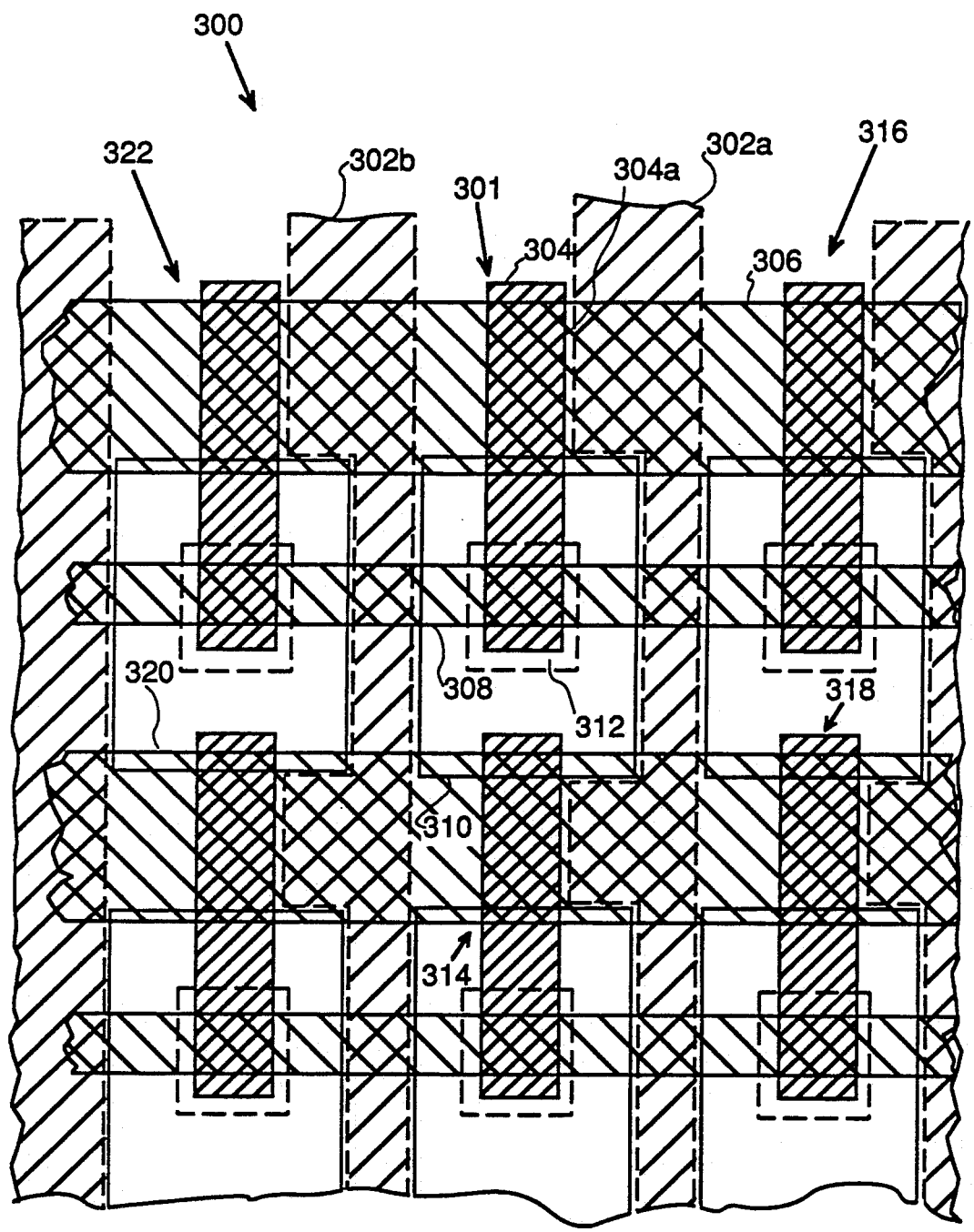
FIG. 10 illustrates in plan view an array of EEPROM cells constructed in accordance with another embodiment of the invention.

FIG. 10 illustrates an array 300 of split gate EEPROM transistors such as transistor 301 constructed in accordance with another embodiment of the invention. Transistor 301 includes a drain region 302a, a source region 302b, and a floating gate 304. Regions 302a and 302b are typically formed by diffusion or ion implantation of a selected N type impurity into a substrate. As with the previously described embodiment, floating gate 304 is typically polysilicon but can be formed from other conductive material as well. Also as described above, region 302a is self-aligned with an edge 304a of floating gate 304.

Transistor 301 also includes a control gate 306 which directly controls conduction through the portion of the channel not covered by floating gate 304 (drain region 302a extends to edge 304a of floating gate 304, but source region 302b does not extend all the way to floating gate 304).

An erase gate 308 (formed concurrently with control gate 306) extends over the thick field isolation oxide layer of array 300 and over floating gate 304. (The contour of the thick field oxide is illustrated in FIG. 10 by line 310.) A tunneling oxide layer separates floating gate 304 from erase gate 308.

The structure illustrated in FIG. 10 is constructed using the same process steps as those described above in relation to FIGS. 8a to 8h and 9a to 9h. As described above, the insulation layer formed above floating gate 304 is manufactured in a two-step process in which a first layer of oxide is grown on floating gate 304, a portion of the oxide in an erase area 312 is removed from floating gate 304 and a second oxide layer is formed on floating gate 304. FIG. 10 illustrates the contour of the window region in the erase mask used to etch oxide off of floating gate 304 in erase area 312. As can be seen, this mask is an oversized mask which exposes the erase area and a portion of the field oxide of the device. Because this mask is an oversized mask, slight misalignment of the erase area mask does not adversely affect performance of the transistor. Also, even though a portion of the field oxide is exposed during the step of etching the oxide on floating gate 304, because of the thickness of the field oxide, any removal of field oxide during this step is minimal and inconsequential.

It is noted that in array 300, source and drain regions 302b and 302a are shared by transistor 301, transistor 314 and any other transistors along the same column as transistors 301 and 314. Further, drain region 302a is also used as a source region for transistor 316 and 318. This architecture is commonly known as a "virtual ground" architecture because the source and drain regions are decoded to serve alternatively as the source (which is grounded) of one column of transistors, or as a drain for an adjacent column of transistors.

When it is desired to sense the state of EEPROM cell 301, a positive voltage is placed on drain 302a, while source 302b, erase gate 308 and control gate 320 are held at ground, and control gate 306 is brought to about 5 volts. The state of transistor 301 is sensed by sensing the current between drain 302a and source 302b.

To program transistor 301, a higher positive voltage, typically 8 or 9 volts, is placed on drain 302a, source 302b, and gate 320 are pulled to ground, and control gate 306 is brought to approximately 12 volts. All other source and drain regions in the array are pulled to ground. In addition, all of the erase gates are held at ground during programming. To erase all transistors along common row cells, e.g. transistors 301, 316 and 322, control gate 306 is held at ground and erase gate 308 is held at a high voltage, typically 20 to 30 volts. All source/drain regions can be held at either zero volts or at an intermediate voltage of approximately 8 to 10 volts. The purpose of holding the source and drain regions at such an intermediate voltage is to reduce the electric field in the insulation between erase gate 308 and the source/drain regions. By reducing the electric field through this insulation layer, the stress applied to the insulation between the source/drain regions and erase gate 308 is reduced.

It is noted that during electrical erase, it is possible to leave floating gate 304 positively charged. In fact, the positive charge left on floating gate 304 may cause an electric field sufficiently strong to form an inversion region underneath floating gate 304 even when zero volts are applied to control gate 306. This will not interfere with the operation of the EEPROM because transistor 301 incorporates a split-gate architecture.

All other control gates and erase gates in array 300 are also held at ground potential during the single row erase. Of course, it is possible to erase all the cells in the array in parallel by raising the voltage at all erase gates to between 20 and 30 volts simultaneously.

In the memory array of FIG. 10, the long source/drain regions run continuously for the entire length of each column of cells. To reduce the series resistance of these regions, metal line conductors (not shown in FIG. 10) run parallel to the source/drain regions and contact them periodically, typically every 8 or 16 cells through vias (not shown).

Figure 11:
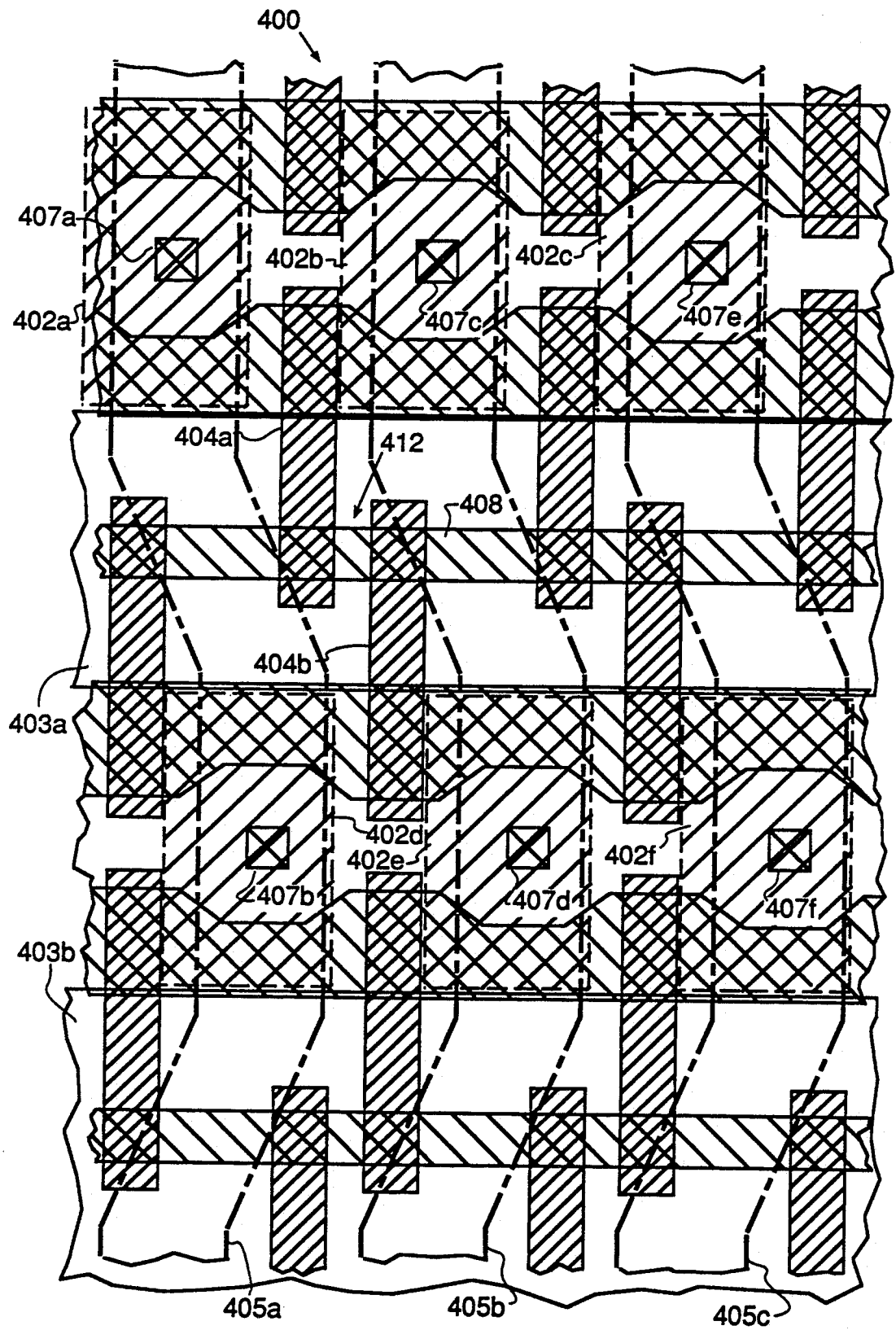
FIG. 11 illustrates in plan view another array of EEPROM cells constructed in accordance with the invention.

FIG. 11 illustrates another embodiment of an array 400 constructed in accordance with the invention. Array 400 is similar to array 300 in FIG. 10 except that instead of forming long source/drain regions which extend along an entire column of transistors, the source/drain regions along each column of transistors are interrupted every two cells by field oxide isolation 403a, 403b. Thus, the array of FIG. 11 includes source/drain islands 402a to 402f. Source/drain islands 402a and 402d contact metal line 405a through vias 407a and 407b, source/drain islands 402b and 402e contact metal line 405b through vias 407c and 407d, and source/drain islands 402c and 402f contact metal line 405c through vias 407e and 407f. The architecture of this array permits erase gate 408 to be shared between floating gates 404a and 404b from cells on opposite sides of erase gate 408. Furthermore, in this particular architecture, erase gate 408 runs entirely over thick field isolation oxide. This has the advantage that during electrical erase, when erase gate 408 is raised to a high erase voltage (e.g. 20 to 30 volts), the possibility of a catastrophic short between the erase gate and the source or drain diffusions is eliminated entirely. This results in more reliable cells than the cells disclosed in the previously discussed embodiments. As with the array of FIG. 10, area 412 is provided for establishing a special tunnel oxide layer between floating gate 404a and erase gate 408.

It will be appreciated in light of the above discussion that the structure of the present invention overcomes many of the disadvantages of the prior art EEPROM transistors of FIGS. 1 to 4. In addition, the EEPROM of the present invention also provides a number of advantages over the structures described in the above-mentioned Kuo et al. patent. For example, as mentioned above, the present EEPROM is constructed such that the drain is self-aligned with the floating gate. This permits enhanced programming efficiency. In contrast, Kuo uses a process which is incompatible with self-aligning the floating gate and drain, because Kuo forms his source and drain prior to forming his floating gate. Thus, Kuo does not achieve the benefits of the present invention. Further, Kuo's EEPROM is incompatible with drain-floating gate self-alignment for at least the following two reasons. First, Kuo relies on thick oxide between his source and erase gate to prevent the erase gate-source insulation from breaking down. Kuo grows this thick oxide during part of the field oxide growth cycle. Since Kuo's source and drain extend under oxide grown during part of the field oxide growth cycle, Kuo cannot align his source and drain with the floating gate (which is formed after the field oxide).

In contrast, in the EEPROM of FIGS. 5 to 10, because the voltage at the source region is raised during erase, the erase gate to source insulation is not stressed as severely in our EEPROM as in Kuo's. Accordingly, it is not necessary to grow extremely thick oxide over the source region in the present EEPROM, and thus the source/drain implant can be performed after the field oxide and floating gate are formed.

In EEPROM array 400 of FIG. 11, the source/drain regions do not extend under the erase gate. Thus, it is not necessary to grow extremely thick oxide over the source/drain regions in array 400 either.

Also, because of the manner in which Kuo arranges his floating gates, if Kuo desired to form his source region after his floating gate, his source region would include twice as many loops around the portions of his floating gates perpendicular to the erase gate as the number of loops in the present invention. In contrast, in the embodiment of FIG. 5, because portions 104a' to 104h' of floating gates 104a to 104h are arranged in pairs such that portion 104a' is adjacent to portion 104b', portion 104c' is adjacent to portion 104d', etc., the number of loops in the path followed by source 110 is half that which would be required by Kuo, and thus, the EEPROM of the present invention exhibits less source resistance than would be achieved by Kuo.

While the invention has been described with respect to a specific embodiment, those skilled in the art will recognize that changes can be made in form and detail without departing from the spirit and scope of the invention. Accordingly, all such modifications come within the present invention.

We claim:

1. An array of electrically erasable programmable read only memory (EEPROM) transistors comprising:
    first and second rows of transistors, each transistor within said first and second rows of transistor including a uniquely associated floating gate and a uniquely associated drain.
    a first control gate extending over, and insulated from, the floating gates of said first row of transistor,
    said first control gate serving as the control gate of said first row of transistors;
    a second control gate extending over, and insulated from, the floating gates of said second row of transistors, said second control gate serving as the control gate of said second row of transistors;
    an erase gate electrically insulated from said first and second control gates and extending over, and insulated from, a portion of each of the floating gates of said first and second rows of transistors; and
    a source region serving as a common source for said first and second rows of transistors,
    wherein said erase gate extends along a first axis, and wherein each of said floating gates within said first row includes a first portion extending in a substantially linear direction substantially parallel to said erase gate and adjacent to its associated drain, each floating gate also including a second portion extending from an end of its associated first portion to said erase gate in a direction substantially perpendicular to its associated first portion, each of said second portions extending under part of, but insulated from, said erase gate, and wherein floating gates within said first row are arranged in mutually adjacent pairs, and wherein each second portion of a floating gate within a pair extends from the end of its associated first portion closest to the other floating gate within its associated pair, and wherein floating gates within said second row are arranged in mutually adjacent pairs so that each second portion of a floating gate within said second row extends from the end of its associated first portion closest to the other floating gate within its associated pair.

2. The array of claim 1 wherein the second portions of floating gates within said first row are staggered relative to the second portions of floating gates within said second row so as to pass under said erase gate at different points along said first axis, and wherein said common source region follows a serpentine path extending around each of the second portions of said floating gates and underneath, but insulated from, said erase gate.

3. The array of claim 1 wherein said common source region extends underneath, but is insulated from, said erase gate and the second portion of each of said floating gates.

4. The array of claim 1 further comprising mean for applying a first voltage to said common source region when one of said transistors is being erased, said first voltage being higher than a voltage normally applied to said common source region when said one of said transistors is being read.

5. The array of claim 1 wherein said erase gage is formed in the same conductive layer as said control gate.

6. The array of claim 1 wherein each of said drains is self-aligned with its associated floating gate.

7. The array of claim 1 wherein each of said transistors employs a split-gate architecture.

* * * * *